United States Patent [19]

Kokubo et al.

[11] Patent Number: 5,389,492
[45] Date of Patent: Feb. 14, 1995

[54] RESIST COMPOSITION COMPRISING A SILOXANE OR SILSESQUIOXANE POLYMER HAVING SILANOL GROUPS IN A COMPOSITION WITH A NAPHTHOQUINONE COMPOUND

[75] Inventors: Tadayoshi Kokubo; Atsushi Sakamoto, both of Shizuoka; Akinobu Tanaka; Hiroshi Ban, both of Kanagawa, all of Japan

[73] Assignees: Fuji Photo Film Co., Ltd., Kanagawa; Nippon Telegraph and Telephone Corporation, Tokyo, both of Japan

[21] Appl. No.: 225,088

[22] Filed: Apr. 8, 1994

Related U.S. Application Data

[63] Continuation of Ser. No. 708,580, May 31, 1991, abandoned.

[30] Foreign Application Priority Data

Jun. 1, 1990 [JP] Japan .................. 2-141659

[51] Int. Cl.$^6$ .................. G03F 7/023; G03F 7/30
[52] U.S. Cl. .................. 430/191; 430/165; 430/192; 430/193
[58] Field of Search .............. 430/192, 193, 191, 165

[56] References Cited

U.S. PATENT DOCUMENTS

| | | | |
|---|---|---|---|
| 4,536,465 | 8/1985 | Uehara et al. | 430/192 |
| 4,657,843 | 4/1987 | Fukuyama et al. | 430/323 |
| 4,722,881 | 2/1988 | Ueno et al. | 430/192 |
| 4,822,716 | 4/1989 | Onishi et al. | 430/192 |
| 5,087,553 | 2/1992 | Adachi et al. | 430/323 |
| 5,098,816 | 3/1992 | Babich et al. | 430/280 |
| 5,182,183 | 1/1993 | Tomiyasu et al. | 430/192 |
| 5,264,319 | 11/1993 | Sugiyama et al. | 430/191 |

OTHER PUBLICATIONS

Sir Derek Barton and W. David Ollis, "Comprehensive Organic Chemistry: The Synthesis and Reactions of Organic Compounds," vol. 3, Sulphur, Selenium, Silicon, Boron, Organometallic Compounds, pp. 576–577.
W. T. Grubb, "A Rate Study of the Silanol Condensation Reaction at 25° in Alcoholic Solvents," Jan. 16, 1954, vol. 76, pp. 3408–3409.

Primary Examiner—Charles L. Bowers, Jr.
Assistant Examiner—John S. Chu
Attorney, Agent, or Firm—Sughrue, Mion, Zinn, Macpeak & Seas

[57] ABSTRACT

A resist composition comprising a compound having an active hydrogen and an alkali-soluble siloxane polymer containing in the molecules thereof at least one unit selected from a unit represented by formula (I) and a unit represented by formula (II)

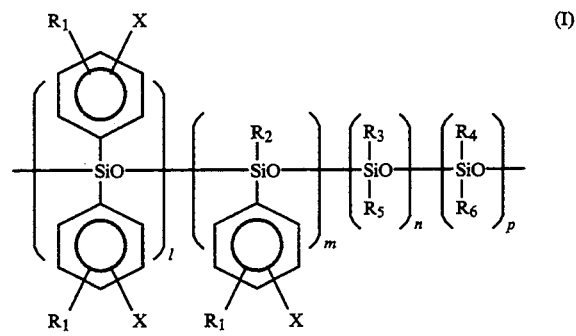

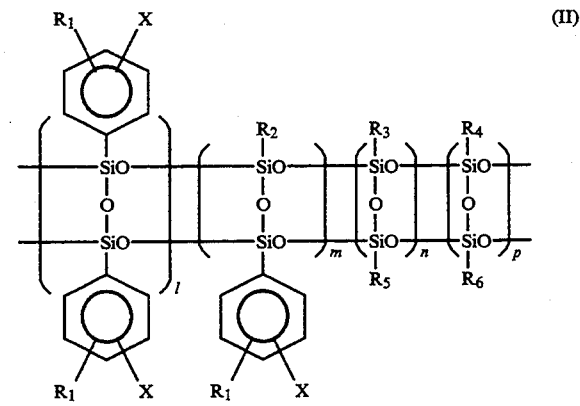

wherein the X's are the same or different and each (Abstract continued on next page.)

represents one member selected from the group consisting of hydrogen,

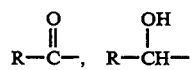

(where R represents hydrogen, a hydrocarbon group, or a substituted hydrocarbon group); and a carboxyl group;

$R_1$, $R_2$, $R_3$, $R_4$, $R_5$, and $R_6$ are the same or different and each represents one member selected from the group consisting of hydrogen, a hydroxyl group, a substituted or unsubstituted aliphatic hydrocarbon group, and a substituted or unsubstituted aromatic hydrocarbon group, provided that at least one of $R_1$ to $R_6$ is a hydroxyl group; and l, m, n, and p each is 0 or a positive integer, provided that l and m are not 0 at the same time.

2 Claims, No Drawings

RESIST COMPOSITION COMPRISING A SILOXANE OR SILSESQUIOXANE POLYMER HAVING SILANOL GROUPS IN A COMPOSITION WITH A NAPHTHOQUINONE COMPOUND

This is a continuation of application Ser. No. 07/708,580, filed May 31, 1991, now abandoned.

FIELD OF THE INVENTION

The present invention relates to a resist composition which has high resistance to oxygen plasmas and can form high precision fine patterns such as semiconductor circuits.

BACKGROUND OF THE INVENTION

With the trend toward fineness in LSI (large scale integrated) circuit processing, resist materials for lithography are also required to have high resolution capabilities. From the standpoint of forming especially fine patterns, photolithography using short wavelength light, a lens with a large numerical aperture, or lithography using high energy rays such as electron rays, are regarded as advantageous. However, use of such a lithography illuminant or optical system for attaining higher resolution capabilities causes the photolithography to have a reduced focal depth and the high energy ray lithography to have problems such as vicinal effects, etc. As an expedient to solve such a problem, it has been proposed to conduct lithography using a multi-layered resist coating. In particular, in practical use of a multilayered resist, a pattern formed in the upper layer by lithography is transferred to the lower layer by reactive ion etching with an oxygen plasma treatment (hereinafter abbreviated as $O_2$-RIE) with the patterned upper layer as a mask, thereby obtaining a resist pattern having a high aspect ratio (B. J. Lin, Solid State Technol., 24, 73 (1981)). In the above method, the upper layer of the resist is particularly required to have high resistance to $O_2$-RIE. For this purpose, it has been proposed to form a silicon-containing polymer layer, as an inner mask, between the upper and lower layer, to make up for the insufficient $O_2$-RIE resistance of the upper layer. However, it is more preferred to enhance the $O_2$-RIE resistance by incorporating silicon into the upper layer of the resist.

For such a purpose, many resist material techniques have been proposed. The use of an alkali-soluble polysilsesquioxane (hereinafter abbreviated as APSQ) containing an acetyl group and/or hydroxyl group as the main polymer ingredient is one of the most advantageous resist materials for practical use. Such resists are described, for example, in JP-A-63-239440 (the term "JP-A" as used herein refers to a "published unexamined Japanese patent application"), JP-A-63-269150, JP-A-1-201337, JP-A-1-201653, JP-A-64-44933, JP-A-64-46746, JP-A-64-46747, and JP-A-1-222254. As described in these references, APSQ can be used, along with a naphthoquinonediazide compound, to form a positive photoresist, from which a fine image can be formed through alkali development in a manner similar to ordinary positive photoresists. The APSQ-based composition may also be used as a material for forming a negative resist pattern using an image-reversal technique. It can further be used to form an image by means of high energy rays. In addition to circuit pattern formation, it is usable for other applications such as an interlaminar insulating film. The APSQ is characterized as having exceedingly high heat resistance because of its high glass transition temperature.

However, all of the resists employing APSQ have a common drawback, in that an insoluble residue (scum) is apt to form in areas to be removed by development after light exposure. Scum is formed in those areas of an extracted pattern which are to be removed by development in the case of positive image formation. In the case of using an image-reversal technique, scum appears in those areas of a pattern which are to be removed by a second exposure to light.

Formation of such scum in circuit patterns is not desirable, in that it may cause wiring omissions or short circuits in semiconductor circuits obtained through processing using these resist patterns. The same scum phenomenon is also observed with ordinary (silicon-omitting) positive photoresists consisting of a novolak resin and a naphthoquinonediazide photosensitive substance. For these ordinary positive photoresists, it has been disclosed, for example, in JP-A-63-25650, to prevent scum formation by adding an additive to developing solutions and by selecting the optimum composition and structure for the novolak resin (disclosed in, for example, JP-A-63-2044 and JP-A-64-11259). However, a general explanation for the cause of scum formation has not yet been established. In the case of silicon-containing resists comprising different base polymers, there has been no understanding as to which factors bring about scum. Because of the above, it is difficult to eliminate the scum problem from the silicon-containing resists utilizing APSQ and, hence, there has been a strong desire for development of a resist that is free from such problem.

SUMMARY OF THE INVENTION

The present inventors have unexpectedly found that a silicon-containing resist prepared using an APSQ and a compound having active hydrogen is extremely less apt to suffer scum formation. The present invention has been completed based on this finding.

Accordingly, an object of the present invention is to provide a silicon-containing resist composition for alkali development, which composition employs a siloxane polymer and is less prone to scum formation.

Other objects and effects of the present invention will be apparent from the following description.

The present invention provides a resist composition comprising a compound having an active hydrogen and an alkali-soluble siloxane polymer containing in the molecules thereof at least one of a unit represented by formula (I) and a unit represented by formula (II)

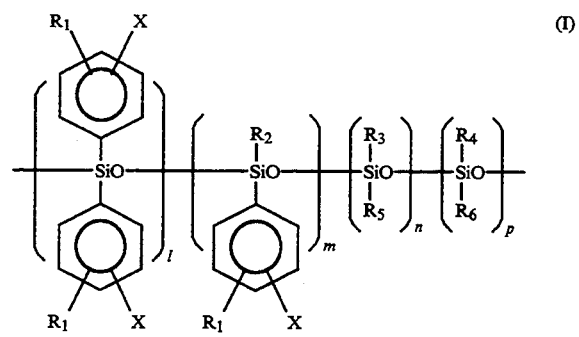

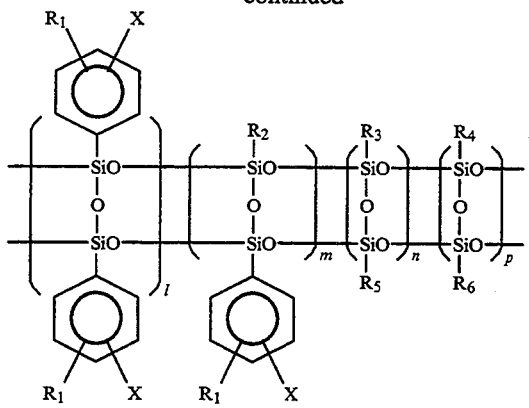 (II)

wherein the X's are the same or different and each represents one member selected from the group consisting of hydrogen,

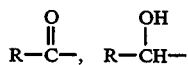

(where R represents hydrogen, a hydrocarbon group, or a substituted hydrocarbon group), and a carboxyl group;

$R_1$, $R_2$, $R_3$, $R_4$, $R_5$, and $R_6$ are the same or different and each represents one member selected from the group consisting of hydrogen, a hydroxyl group, a substituted or unsubstituted aliphatic hydrocarbon group, and a substituted or unsubstituted aromatic hydrocarbon group, provided that at least-one of $R_1$ to $R_6$ is a hydroxyl group; and l, m, n, and p each is 0 or a positive integer, provided that l and m are not 0 at the same time.

DETAILED DESCRIPTION OF THE INVENTION

The resist composition of the present invention and processes for producing the composition are explained below in detail.

The siloxane polymer in the composition of the present invention has exceedingly high $O_2$-RIE resistance because the polymer backbone is of a polysiloxane structure, so that it can be advantageously used for forming fine patterns having high aspect ratios. Further, since a number of phenyl groups are present as pendant groups in the polymer despite the polysiloxane structure, the Tg of the polymer is not lower than room temperature and the polymer is not viscous, so that smooth films can be formed. In addition, because a hydrophilic silanol group is incorporated into the polymer through a Friedel-Crafts reaction or another reaction, the polymer is soluble in aqueous alkali solutions.

For this reason, when a composition obtained by adding an o-naphthoquinone compound to a siloxane polymer containing in the molecules thereof at least one of units represented by formulae (I) and (II) is irradiated with ultraviolet rays, the o-naphthoquinone compound in the irradiated areas is converted to the corresponding indenecarboxylic acid that is soluble in alkali. The irradiated areas can, therefore, be removed by alkali development to form a positive pattern (See, e.g., JP-A-63-239440, JP-A-64-44933, JP-A-64-46746, JP-A-64-46747, JP-A-1-106042, JP-A-1-222254).

On the other hand, when irradiated with electron rays, X-rays, or far ultraviolet rays, the above composition decreases in alkali solubility. Because of this, by irradiating the coating of the composition with high energy rays through a mask, and then exposing the whole areas of the resulting coating to ultraviolet rays and subjecting the coating to alkali development, only the areas irradiated with high energy rays remain, thus forming a negative pattern. In this case, the reaction induced by high energy ray irradiation can be accelerated, and a greater effect can be obtained, by heating the coating after the high energy ray irradiation (See, e.g., JP-A-63-269150, JP-A-1-201337).

All of these patterns show high resolution because they undergo substantially no swelling in development.

Known o-naphthoquinonediazide compounds include those of benzophenone base and those condensed with novolak resins. However, the compounds having the following formulas are preferred in the present invention.

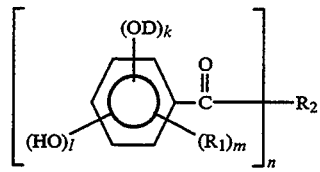

wherein $R_1$ represents hydrogen, a halogen, a substituted or unsubstituted aliphatic hydrocarbon group or a substituted or unsubstituted aromatic hydrocarbon group; $R_2$ is a substituted or unsubstituted aliphatic hydrocarbon group or a substituted or unsubstituted aromatic hydrocarbon group; D is a 1,2-naphthoquinonediazide-4-sulfonyl group or a 1,2-naphthoquinonediazide-5-sulfonyl group; l is 0 or an integer from 1 to 3; k and m, which may be the same or different, each is 0 or an integer from 1 to 4; (k+l+m) is 5; (k+l) is a positive integer; and n is an integer from 1 to 4;

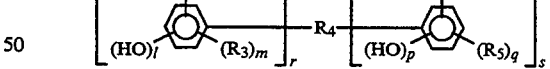

wherein $R_3$ and $R_5$, which may be the same or different, each represents hydrogen, a halogen, a substituted or unsubstituted aliphatic hydrocarbon group or a substituted or unsubstituted aromatic hydrocarbon group; $R_4$ is hydrogen, oxygen, sulfur, a sulfonyl group, a substituted or unsubstituted aliphatic hydrocarbon group, or a substituted or unsubstituted aromatic hydrocarbon group; D is a 1,2-naphthoquinonediazide-4-sulfonyl group or a 1,2-naphthoquinonediazide-5-sulfonyl group; l and p, which may be the same or different, each is 0 or an integer from 1 to 3; k, m, n and q, which may be the same or different, each is 0 or an integer from 1 to 4; (k+l+m) and (n+p+q) each is 5; (k+l) is a positive integer; r is an integer from 1 to 4; and s is 0 or an integer from 1 to 3; and

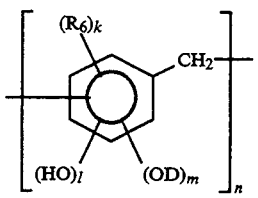

wherein $R_6$ represents hydrogen or a substituted or unsubstituted aliphatic hydrocarbon group; D is a 1,2-naphthoquinonediazide-4-sulfonyl group or a 1,2-naphthoquinonediazide-5-sulfonyl group; k, l and m, which may be the same or different, each is 0, 1 or 2; (k+l+m) is 4; (l+m) is a positive integer; and n is an integer larger than 2.

The amount of the o-naphthoquinone compound incorporated into the resist composition is generally in the range of from 5 to 40% by weight, based on the total amount of the resist composition. If the amount thereof is below 5% by weight, dissolution of the polymer compound into alkali developing solutions cannot be prevented. If the amount thereof exceeds 40% by weight, the resulting resist composition has a reduced Si content, which disadvantageously results in impaired $O_2$-RIE resistance.

One method for producing a siloxane polymer containing a repeating unit represented by formula (I) is to conduct a ring-opening polymerization of a phenylcyclosiloxane, such as octaphenylcyclotetrasiloxane or hexaphenylcyclotrisiloxane, with the aid of an alkali metal hydroxide such as potassium hydroxide or an alkylated alkali metal, such as butyllithium, followed by modification of the resulting polydiphenylsiloxane.

In another method, a phenylcyclosiloxane is subjected not to homopolymerization but rather to copolymerization with tetramethyltetraphenylcyclotetrasiloxane, octamethylcyclotetrasiloxane, or the like. In the case where a pattern having especially high resolution is desired, a monodisperse polymer in which the molecules have the same molecular weight is preferred. The desired monodisperse polymer can be obtained by subjecting a cyclosiloxane to anionic living polymerization using a catalyst such as butyllithium, followed by modification of the resulting polymer.

A siloxane polymer containing a unit represented by formula (II) or containing both a unit represented by formula (I) and a unit represented by formula (II) may be produced by a method in which a phenylsilsesquioxane polymer easily obtained by the hydrolysis of a silane compound represented by E—Si—$Z_3$ (wherein E is a substituted or unsubstituted aromatic group, H, etc., and Z is a halogen or an alkoxy group) is modified.

Modification of the siloxane polymer for use in the present invention may be accomplished by hydrolysis after the Friedel-Crafts reaction, or by the oxidation reaction of SiH groups on the polymer.

Examples of the compound employed in the present invention and having an active hydrogen include benzoic acid, salicylic acid, thiosalicylic acid, p-hydroxybenzoic acid, 3,5-dihydroxybenzoic acid, p-aminobenzoic acid, anthranilic acid, mercaptobenzophenone, p-hydroxyphenylacetic acid, phenylurea, diphenylurea, diphenylthiourea, benzamide, benzenesulfonamide, acetylacetone, polyvinylphenol, a novolak resin, bisphenol A, and the like. More preferably, the compound having active hydrogen is one which contains in the molecule thereof both of an acid group and a functional group having active hydrogen. Examples of such a preferred compound include salicylic acid, thiosalicylic acid, p-hydroxybenzoic acid, 3,5-dihydroxybenzoic acid, p-aminobenzoic acid, anthranilic acid, p-hydroxyphenylacetic acid, and the like. However, the compound having active hydrogen is not limited to these examples.

The present invention is explained below in more detail with reference to the following Production Examples for the APSQ, Examples, and Comparative Examples, but these examples are not to be construed as limiting the scope of the invention.

Production Example 1

Into a 300-ml flask equipped with a stirrer, thermometer, and dropping funnel were placed 15 g of anhydrous aluminum chloride and 50 ml of acetyl chloride. The contents in the flask were then stirred. Thereinto was gradually added dropwise a solution prepared by dissolving 5 g of polyphenylsilsesquioxane having a molecular weight of 7,800 in 50 ml of acetyl chloride. Reaction was then allowed to proceed while the temperature of the mixture was kept at 25° C. As the reaction proceeded, hydrogen chloride was evolved.

After the reaction was conducted for 3 hours, the contents in the flask were cooled and poured into ice-cold water.

The resulting mixture was agitated well to decompose the aluminum chloride, and the precipitated polymer was filtered off, sufficiently washed with water, and then dried in a vacuum dryer.

Production Example 2

Into a 300-ml flask equipped with a stirrer, thermometer, and dropping funnel were placed 25 g of stannic chloride and 50 ml of acetic anhydride. The contents in the flask were then stirred. Thereinto was gradually added dropwise a solution prepared by dissolving 6 g of diphenylsilanediol in 50 ml of acetic anhydride. The subsequent procedures were conducted in the same manner as in Production Example 1, thereby obtaining a siloxane polymer. The polymer thus obtained had a molecular weight of 1,500.

Production Example 3

Into a 300-ml flask equipped with a stirrer, thermometer, and dropping funnel were placed 15 g of anhydrous aluminum chloride and 50 ml of acetyl chloride. The contents in the flask were then stirred. Thereinto was gradually added dropwise a solution prepared by dissolving 5 g of polyphenylsilsesquioxane having a molecular weight of 1,100 in 50 ml of acetyl chloride. Reaction was then allowed to proceed while the temperature of the mixture was kept at 25° C. As the reaction proceeded, hydrogen chloride was evolved.

After the reaction was conducted for 3 hours, the contents in the flask were cooled and poured into ice-cold water. The resulting mixture was agitated well to decompose the aluminum chloride, and the precipitated polymer was filtered off, sufficiently washed with water, and then dried in a vacuum dryer.

Production Example 4

In a mixed solvent composed of 37 ml of MIBK (methyl isobutyl ketone) and 13 ml of THF were dissolved 2.0 g of trichlorohydrosilane and 3.0 g of phenyltrichlorosilane. This solution was cooled to 0° C. Thereinto was added dropwise with stirring 4.0 g of triethylamine over a period of 5 minutes. After this mixture was stirred for 5 minutes, 6.3 g of water was added dropwise over a period of 20 minutes and the mixture was then stirred for 1 hour. The temperature of the resulting reaction mixture was raised to and maintained at 85° C. After the reaction mixture was stirred for 4 hours, it was cooled to room temperature. The aqueous layer was removed. The solvent in the organic layer was then evaporated, and finally the residue was dried in a vacuum dryer. The polymer thus obtained had a molecular weight of 900.

Into a 200-ml flask equipped with a stirrer were placed 3 g of the above obtained polymer and 30 ml of toluene. The mixture in the flask was then stirred to dissolve the polymer. Thereinto was added a solution prepared by dissolving 3.5 g of m-chloroperbenzoic acid in 90 ml of toluene. Reaction was then conducted for 6 hours, subsequently the solvent in the organic layer was evaporated, and finally the residue was dried in a vacuum dryer.

The extent of incorporation of hydroxyl groups into the polymer was ascertained by $^1$H-NMR spectroscopy, in which a signal of the OH group in silanol group was observed around $\delta=6.5$, and also by infrared spectrophotometry, in which a signal of the OH group in the silanol group was observed around 3,400 cm$^{-1}$.

Production Example 5

Into a 200-ml flask equipped with a stirrer, thermometer, and hydrogen chloride gas-introducing tube were placed 2.7 g of anhydrous aluminum chloride, 5 g of polyphenylsilsesquioxane having a molecular weight of 1,100, and 130 ml of toluene. The contents in the flask were stirred in a nitrogen stream to dissolve the solid ingredients. Introduction of hydrogen chloride gas was initiated, while the temperature of the mixture was kept at 25° C. As the reaction proceeded, benzene was formed.

After the reaction was conducted for 8 hours, the contents in the flask were cooled and poured into 250 g of ice-cold water. The resulting mixture was agitated well to decompose the aluminum chloride, and 50 g of ethyl ether was added thereto to dissolve the precipitate. The aqueous layer was removed. Subsequently, the solvent in the organic layer was evaporated, and finally the residue was dried in a vacuum dryer. The molecular weight of the thus-obtained polymer was 1,000. The extent of incorporation of hydroxyl groups into the polymer was ascertained by $^1$H-NMR spectroscopy, in which a signal of the OH group in silanol group was observed around $\delta=6.5$, and also by infrared spectrophotometry, in which a signal of the OH group in the silanol group was observed at around 3,400 cm$^{-1}$.

Example 1

To the siloxane polymer obtained in Production Example 1 were added 10% by weight of thiosalicylic acid and 20% by weight of a naphthoquinone compound represented by the following formula.

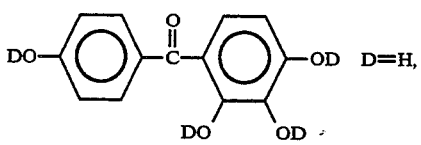

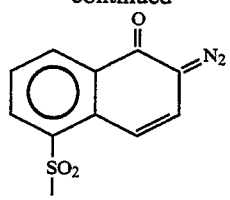

esterification degree 70%

The thus-obtained resist composition was coated on a silicon wafer at a film thickness of about 0.3 μm and pre-baked at 80° C. for 20 minutes. The pre-baked coating was then irradiated with high energy rays (electron rays, X-rays, or far ultraviolet rays). The irradiated coating was heated at 110° C. for 30 minutes in a thermostatic chamber. After the heating, the whole surface of the coating was irradiated, at a dose of 500 mJ/cm$^2$, with light emitted by an Xe lamp. Each of the thus-irradiated samples was developed with a developing solution (2.38 wt % aqueous solution of tetramethylammonium tetrahydroxide), and the irradiation dose that caused the residual film thickness in the irradiated area to be 50% of the initial film thickness was taken as the sensitivity to the high energy rays. Resolution was evaluated by measuring the size of the minimum pattern formed by reproducing a spaced line pattern.

Scum (insoluble residue) formation was evaluated by examining spaces between lines in a 0.7 μm line pattern with an SEM.

The results of the above evaluations are shown in Table 1.

Example 2

A resist composition prepared by adding to the siloxane polymer obtained in Production Example 2 10% by weight of p-hydroxyphenylacetic acid and 20% by weight of the same naphthoquinone compound as that used in Example 1 was evaluated for sensitivity, resolution, and scum formation in the same manner as in Example 1.

The results obtained are shown in Table 1.

Example 3

A resist composition prepared by adding to the siloxane polymer obtained in Production Example 3 10% by weight of p-aminobenzoic acid and 20% by weight of the same naphthoquinone compound as that used in Example 1 was evaluated for sensitivity, resolution, and scum formation in the same manner as in Example 1.

The results obtained are shown in Table 1.

Example 4

A resist composition prepared by adding to the siloxane polymer obtained in Production Example 4 10% by weight of anthranilic acid and 20% by weight of the same naphthoquinone compound as that used in Example 1 was evaluated for sensitivity, resolution, and scum formation in the same manner as in Example 1.

The results obtained are shown in Table 1.

Example 5

A resist composition prepared by adding to the siloxane polymer obtained in Production Example 5 10% by weight of p-hydroxybenzoic acid and 20% by weight of the same naphthoquinone compound as that used in Example 1 was evaluated for sensitivity, resolution, and scum formation in the same manner as in Example 1.

The results obtained are shown in Table 1.

Comparative Example 1

For the purpose of comparison with the present invention, a resist composition consisting of the siloxane polymer obtained in Production Example 1 and 20% by weight of the same naphthoquinone compound as that used in Example 1 was evaluated for sensitivity, resolution, and scum formation in the same manner as in Example 1.

The results obtained are shown in Table 1.

TABLE 1

| Example No. | Polymer | Electron Rays (accelerating voltage 20 kV) | | X-Rays (CuLα line 13.3 Å) | | Ultraviolet Rays (1 kW Xe-Hg) | | Scum[a] (0.7 μm pattern) |
|---|---|---|---|---|---|---|---|---|
| | | Sensitivity ($\mu C/cm^2$) | Resolution ($\mu m$) | Sensitivity ($mJ/cm^2$) | Resolution ($\mu m$) | Sensitivity ($mJ/cm^2$) | Resolution ($\mu m$) | |
| Example 1 | Production Example 1 | 1.7 | 0.3 | 60 | 0.3 | 20 | 0.5 | o |
| Example 2 | Production Example 2 | 1.4 | 0.3 | 55 | 0.3 | 18 | 0.5 | o |
| Example 3 | Production Example 3 | 2.5 | 0.2 | 75 | 0.2 | 26 | 0.5 | o |
| Example 4 | Production Example 4 | 2.6 | 0.2 | 75 | 0.2 | 28 | 0.5 | o |
| Example 5 | Production Example 5 | 2.4 | 0.2 | 70 | 0.2 | 26 | 0.5 | o |
| Comparative Example 1 | Production Example 1 | 1.3 | 0.4 | 55 | 0.4 | 18 | 0.7 | x | a) o: absent, Δ: slightly present, x: present

Examples 6 to 10 and Comparative Example 2

Each of the same resist compositions as those prepared in Examples 1 to 5 and Comparative Example 1 was coated on a silicon wafer at a film thickness of about 0.3 μm and pre-baked at 80° C. for 20 minutes. The pre-baked coating was then exposed to ultraviolet rays using a mask aligner (PLA-501F) manufactured by Canon Co., Ltd.

Each of the irradiated samples was developed with a developing solution (2.38 wt % aqueous solution of tetramethylammonium tetrahydroxide), and the irradiation dose that caused the residual film thickness in the irradiated area to be zero was taken as sensitivity.

Resolution was evaluated by measuring the size of the minimum pattern formed by reproducing a spaced-line pattern.

Scum (insoluble residue) formation was evaluated by examining spaces between lines in a 0.7 μm line pattern with an SEM.

The results of the above evaluations are summarized in Table 2.

TABLE 2

| Example No. | Polymer | Ultraviolet Rays (250 w Hg lamp) | | Scum[a] (0.7 μm pattern) |
|---|---|---|---|---|
| | | Sensitivity ($mJ/cm^2$) | Resolution ($\mu m$) | |
| Example 6 | Production Example 1 | 28 | 0.5 | o |
| Example 7 | Production Example 2 | 26 | 0.5 | o |
| Example 8 | Production Example 3 | 38 | 0.5 | o |
| Example 9 | Production Example 4 | 40 | 0.5 | o |
| Example 10 | Production Example 5 | 38 | 0.5 | o |
| Comparative Example 2 | Production Example 1 | 36 | 0.7 | x | a) o: absent, Δ: slightly present, x: present

Examples 11 to 15 and Comparative Example 3

Resist compositions were prepared in the same manner as in Examples 1 to 5 and Comparative Example 1 except that in place of the naphthoquinone compound used in these examples, 20% by weight of a naphthoquinone compound represented by the following formula was added.

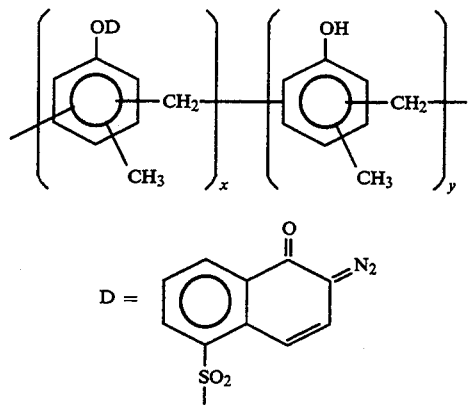

These resist compositions were evaluated for sensitivity, resolution, and scum formation in the same manner as in Example 1.

The results obtained are summarized in Table 3.

TABLE 3

| Example No. | Polymer | Electron Rays (accelerating voltage 20 kV) | | X-Rays (CuLα line 13.3 Å) | | Ultraviolet Rays (1 kW Xe-Hg) | | Scum[a] (0.7 μm pattern) |
|---|---|---|---|---|---|---|---|---|
| | | Sensitivity (μC/cm$^2$) | Resolution (μm) | Sensitivity (mJ/cm$^2$) | Resolution (μm) | Sensitivity (mJ/cm$^2$) | Resolution (μm) | |
| Example 11 | Production Example 1 | 1.9 | 0.3 | 70 | 0.3 | 18 | 0.5 | ○ |
| Example 12 | Production Example 2 | 1.6 | 0.3 | 65 | 0.3 | 16 | 0.5 | ○ |
| Example 13 | Production Example 3 | 2.7 | 0.2 | 80 | 0.2 | 24 | 0.5 | ○ |
| Example 14 | Production Example 4 | 2.8 | 0.2 | 80 | 0.2 | 26 | 0.5 | ○ |
| Example 15 | Production Example 5 | 2.6 | 0.2 | 75 | 0.2 | 24 | 0.5 | ○ |
| Comparative Example 3 | Production Example 1 | 1.7 | 0.4 | 65 | 0.4 | 16 | 0.7 | x |

[a] ○: absent, Δ: slightly present, x: present

Examples 16 to 20 and Comparative Example 4

The same resist compositions as those prepared in Examples 11 to 15 and Comparative Example 3 were evaluated for sensitivity, resolution, and scum formation in the same manner as in Example 6.

The results obtained are summarized in Table 4.

As demonstrated by the above Examples, the resist composition containing an alkali-soluble siloxane polymer and a compound having active hydrogen not only has high sensitivity to ionizing radiation and shows high resolution when exposed to such radiation, but also forms no scum.

Furthermore, the resist composition of the present invention has high resistance to oxygen plasmas since it contains silicon, and the composition can, therefore, be used as the upper resist layer in two-layer resists. Because of the above, the resist composition of the present invention has the advantage of being capable of forming a fine pattern with a high aspect ratio, which has never been attained with the conventional resist materials.

TABLE 4

| Example No. | Polymer | Ultraviolet Rays (250 w Hg lamp) | | Scum[a] (0.7 μm pattern) |
|---|---|---|---|---|
| | | Sensitivity (mJ/cm$^2$) | Resolution (μm) | |
| Example 16 | Production Example 1 | 32 | 0.5 | ○ |
| Example 17 | Production Example 2 | 30 | 0.5 | ○ |
| Example 18 | Production Example 3 | 42 | 0.5 | ○ |
| Example 19 | Production Example 4 | 44 | 0.5 | ○ |
| Example 20 | Production Example 5 | 42 | 0.5 | ○ |
| Comparative Example 4 | Production Example 1 | 42 | 0.7 | x |

[a] ○: absent, Δ: slightly present, x: present

While the invention has been described in detail and with reference to specific embodiments thereof, it will be apparent to one skilled in the art that various changes and modifications can be made therein without departing from the spirit and scope thereof.

What is claimed is:

1. A resist composition comprising a mixture of
   (a) a compound having an active hydrogen and an acid group, said compound being selected from the group consisting of salicylic acid, thiosalicylic acid, p-hydroxybenzoic acid, 3,5-dihydroxybenzoic acid, p-aminobenzoic acid, anthranilic acid, and p-hydroxyphenylacetic acid,
   (b) an alkali-soluble siloxane polymer, in a same composition layer, wherein said alkali-soluble siloxane polymer has a molecular weight of 900 or more and contains in molecules thereof at least one unit selected from the group consisting of a unit represented by formula (I) and a unit represented by formula (II):

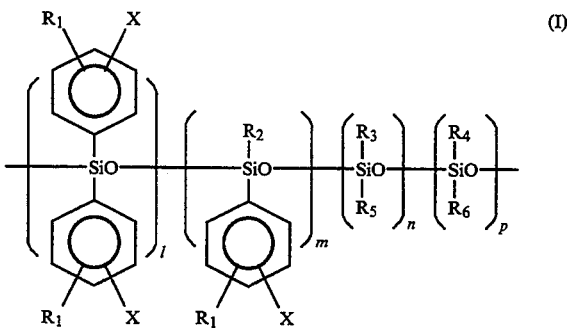

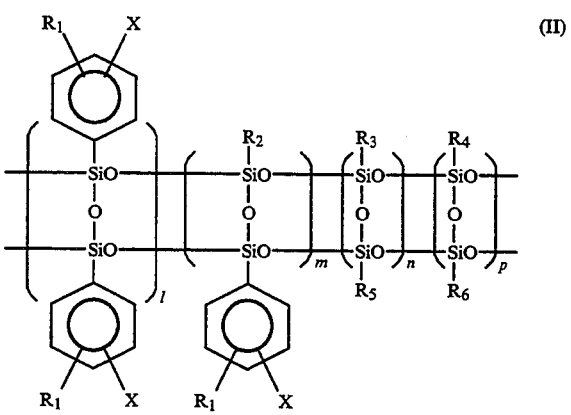

wherein X's are the same or different and each represents one member selected from the group consisting of hydrogen;

where R represents hydrogen, a hydrocarbon group, or a substituted hydrocarbon group;

where R represents hydrogen, a hydrocarbon group, or a substituted hydrocarbon group; and and a carboxyl group;

$R_2$, $R_3$, $R_4$, $R_5$, and $R_6$ are the same or different and each represents one member selected from the group consisting of hydrogen, a hydroxyl group, a substituted or unsubstituted aliphatic hydrocarbon group, and a substituted or unsubstituted aromatic hydrocarbon group, provided that at least one $R_2$ to $R_6$ is a hydroxyl group; and wherein $R_1$ represents one member selected from the group consisting of hydrogen, a substituted or unsubstituted aliphatic hydrocarbon group, and a substituted or unsubstituted aromatic hydrocarbon group, l, m, n, and p each is 0 or a positive integer, provided that l and m are not 0 at the same time, and m, n, and p are not 0 at the same time, and (c) an o-naphthoquinone compound.

2. The resist composition as in claim 1, wherein said o-naphthoquinone compound is present in the resist composition in an amount of from 5 to 40% by weight, based on the total weight of the resist composition.

* * * * *